United States Patent [19]

Ohuchi et al.

[11] Patent Number: 4,611,237
[45] Date of Patent: Sep. 9, 1986

[54] SEMICONDUCTOR INTEGRATED CIRCUIT DEVICE

[75] Inventors: Kazunori Ohuchi; Mitsugi Ogura, both of Yokohama; Kenji Natori, Kamakura, all of Japan

[73] Assignee: Tokyo Shibaura Denki Kabushiki Kaisha, Kawasaki, Japan

[21] Appl. No.: 635,474

[22] Filed: Jul. 30, 1984

Related U.S. Application Data

[63] Continuation of Ser. No. 242,029, Mar. 9, 1981, abandoned.

[30] Foreign Application Priority Data

Mar. 11, 1980 [JP] Japan .................. 55-30523

[51] Int. Cl.$^4$ ............................ H01L 29/78
[52] U.S. Cl. .................. 357/71; 357/23.9; 357/59
[58] Field of Search .............. 357/59, 71, 23.9

[56] References Cited

U.S. PATENT DOCUMENTS

| | | | |
|---|---|---|---|
| 3,964,092 | 6/1976 | Wadham | 357/59 |
| 4,163,246 | 7/1979 | Aomura et al. | 357/71 S |
| 4,222,062 | 9/1980 | Trotter et al. | 357/71 S |
| 4,329,706 | 5/1982 | Crowder et al. | 357/59 |

FOREIGN PATENT DOCUMENTS 2912858 10/1980 Fed. Rep. of Germany .... 357/59 R
45-40745 12/1970 Japan .

OTHER PUBLICATIONS

Japanese Journal of Applied Physics, vol. 18, No. 3, Mar. 1979, Tokyo, Japan: M. Hirabayashi, pp. 581–587.

Primary Examiner—William D. Larkins
Attorney, Agent, or Firm—Oblon, Fisher, Spivak, McClelland & Maier

[57] ABSTRACT

A MOS transistor integrated circuit device has at least one interconnection layer crossing the source and drain regions of a MOS transistor such that it overlies these source and drain regions. An electrical conductive layer is formed on the surface of at least one of the source and drain regions of the MOS transistor. The electrical conductive layer crosses the interconnection layer with an insulating layer therebetween such that it underlies the interconnection layer. The electrical conductive layer is separated from source and drain takeout electrodes and electrically insulated from the interconnection layer.

3 Claims, 9 Drawing Figures

SEMICONDUCTOR INTEGRATED CIRCUIT DEVICE

This application is a continuation of application Ser. No. 242,029, filed Mar. 9, 1981 now abandoned.

This invention relates to a semiconduct or IC (integrated circuit) device including an insulated gate field effect transistor and in particular a semiconductor IC device which permits a greater integration density and higher performance by decreasing the effective resistance of the source and drain regions of the insulated gate field effect transistor.

Recently, the integration density of an LSI (large scale integrated) circuit has been greatly improved and a 64K bit memory and a 16-bit microprocessor has been developed. Such an LSI circuit device can be realized by micro-miniaturizing its constituent elements, for example, insulated gate field effect transistors. The micro-miniaturization of the constituent elements are generally carried out by proportionally scaling down, or reducing, the geometrical size of the constituent elements and value of a power supply voltage in a substantially constant ratio. The integration degree of the IC device is improved by the proportional scaling means and thus the power-delay time product is also improved. In consequence, almost all features such as the channel length of the MOS transistor, thickness of the gate insulated film, threshold voltage, and depth of the junctions of source and drain regions can be proportionally scaled down. However, there exist those parameters which make such scaling-down difficult. As such parameter there exists the sheet resistance of a diffusion layer, polycrystalline silicon interconnection layer etc. The lower limit of the sheet resistivity of these layers is restricted by the solid solubility of an impurity doped in these layers. There is a conflict, however, between the shallowing of the depth of the source and drain junctions and thinning of the polycrystalline silicon interconnection layer for proportional scaling-down on one hand and the lowering of the sheet resistivity of the above-mentioned layers on the other hand. In other words, if a whole IC device is proportionally scaled down, the sheet resistance of the diffusion layer, polycrystalline silicon interconnection layer etc. will not be decreased and rather will be increased. Now consider the channel width of the MOS transistor. The channel width, if being scaled down, can be reduced in the same ratio as that of the channel length. However, it is rare to obtain, for example, an IC device the same in scale as before the scaling-down is effected. In this case, it is a general practice to develop an IC device greater in scale than before scaling-down is carried out. It will be contemplated to make the bit capacity of a memory integrated by scaling down four times larger than that of a memory integrated without scaling down. Even if, however, various parameters are proportionally scaled down so as to realize a large scale integration, the load capacitance of the IC device will not be proportionally reduced in actual practice. It is therefore necessary, in view of the load capacitance, to set the channel width of the MOS transistor in accordance with the load capacitance, and thus the channel width of the MOS transistor cannot be necessarily reduced in a proportional way.

With this in mind, consideration will now be given to a MOS transistor as obtained by being subjected to a patterning operation through a photomask. FIG. 1 shows a schematic plan view of a single MOS transistor included in a general MOS integrated circuit device. In FIG. 1, 11 shows a source region, 12 a drain region, 13 a gate electrode, 14 a drain takeout electrode, 15 a source takeout electrode, 16 a gate takeout electrode, L a channel length and W a channel width. Interconnection layers 17 and 18 of an integrated circuit are arranged acrossing over the source region 11, channel region 12 and gate electrode 13 through an insulating layer. As mentioned above, the channel length L can be proportionally scaled down, but the channel width W is not necessarily reduced in a proportional way. Likewise, the widths D of the source and drain regions are not proportionally scaled down, because their sheet resistivities are not proportionally reduced. In a practical IC device, the source region 11, drain region 12 and isolation region between the MOS transistors occupy a great area compared with that of the channel region (active region). Even where the channel length L is scaled down, an area over which patterning is to be carried out is not greatly reduced unless the other factors such as the widths D of the source and drain regions are proportionally reduced, failing to obtain a higher integration density.

If the widths D of the source and drain regions 11 and 12 are to be reduced so as to improve the integration density, the following serious problem arises. The source and drain regions 11 and 12 are normally formed by the diffusion of an impurity or an ion implantation method, but their sheet resistivities are about 20 $\Omega/\square$, respectively. Then, the resistances of the source and drain regions act as stray resistances as connected in series with the MOS transistor. If the stray resistances of the source and drain regions are increased by scaling down the widths thereof, a drain current as taken from the MOS transistor is greatly decreased as compared with the case where no stray resistances are present. This is due to the fact that when the drain current flows through the transistor a voltage drop occurs due to the stray resistances of the source and drain regions to cause the effective source potential to be raised and the drain potential to be dropped.

FIG. 2A shows a distribution diagram of the stray resistances, whereby the effect of the stray resistances on the drain current can be readily calculated, and FIG. 2B is an equivalent circuit diagram of the transistor of FIG. 2A. In FIG. 2A, the effective channel length L is 2.4 μm and the channel width W is 230 μm. In these Figures, $R_D$ denotes the approximately quadrisected stray resistance of the drain region and $R_D/2$ denotes the approximately quadrisected stray resistance of the source region. In this case, it is assumed that the stray resistance of the source region is one half that of the drain region, because the diffusion width of the source region is double that of the drain region. In the arrangement of FIG. 2B, it is assumed that the transistor of FIG. 2A is divided into five parallel-connected transistor units with the quadrisected stray resistances of their drain regions connected together and the quadrisected stray resistances of their source regions connected together. In the arrangement of FIGS. 2A and 2B, $V_S$, $V_D$ and $V_G$ denote the potentials of the source, drain and gate, respectively. In FIG. 2B, the transistor units are arranged such that the source potential is more increased from the rightmost to the leftmost transistor units. As a result, the gate-to-source potential difference becomes smaller and further the threshold voltage resulting from a body effect (a back bias effect) is increased, preventing a smooth flow of the drain current.

It is to be noted, however, that in FIG. 2B the drain potential is more decreased from the leftmost to the rightmost transistor unit. In spite of the fact that an external bias satisfies the saturation conditions, the transistor is operated in more non-saturated state from the leftmost to the rightmost transistor unit, thus decreasing the drain current. A curve 20 of FIG. 3 shows a relation of a calculated sum $I_D$ (mA) of the drain current of the five transistor units (constituting the equivalent circuit) to the value of the stray resistance $R_D$. In FIG. 3, $V_{SUB}$ represents the substrate potential; 20a as marked "o", the measured value of the drain current of the MOS transistor of which the channel length is 2.4 μm and channel width W is 230 μm and in which there is hardly a stray resistance; and 20b as marked "o", the measured value of the drain current of the MOS transistor of which the channel length L is 2.4 μm and channel width W is 230 μm and which has an n+ diffusion layer of a sheet resistivity 30 $\Omega/\square$ acting as a stray resistance. From the measured value and result of calculation, it will be appreciated that as the value of the stray resistance is increased the drain current of the MOS transistor is greatly decreased and that it is only possible to take a drain current corresponding to below 50% of a theoretical drain current at the stray resistance of zero. When the drain current is decreased due to the stray resistance, then the operation speed of the IC device is lowered, and if, on the other hand, the channel width W is made greater so as to take out a greater drain current, the power dissipation and the area of the element is increased, posing a problem of deteriorating the characteristic of the IC device.

In order to solve this problem, the transistor may be divided into units, as mentioned above, through a patterning process or it may be considered that larger through holes are formed to bring out the source and drain connections. In the LSI circuit, however, the circuit arrangement becomes complicated and the number of interconnections is increased, thus restricting a free choice of patterning. In the foregoing description, the problems arising from decreasing the widths D of the source and drain regions are discussed. However, even if the widths of the source and drain regions are made the same as prior art, an adverse influence of the stray resistance over the drain current becomes greater, because the conductance of the transistor may be made greater by scaling down the channel length L, and the channel width W and the sheet resistances of the source and drain regions are not proportionally scaled down.

It is accordingly the object of this invention to provide a semiconductor IC device adapted to decrease the stray resistances of the source and drain regions of insulated gate field effect transistors, constituting the IC device, to increase the integration density of the MOS transistors as well as improve the characteristic of the IC device.

According to this invention there is provided a semiconductor integrated circuit device having at least one interconnection layer crossing the source and drain regions of an insulated gate field effect transistor such that it overlies these regions. The insulated gate field effect transistor further comprises at least one of electrical conductive layers provided on the surfaces of the source and drain regions and the electrical conductive layer crosses the interconnection layer with an insulating layer therebetween such that it underlies the interconnection layer.

The electrical conductive layer is present only on the source region or the drain region without being connected directly to a source takeout electrode or drain takeout electrode, and decreases a stray resistance as created in the source or drain region and increases a drain current.

This invention can be more fully understood from the following detailed description when taken in conjunction with the accompanying drawings, in which.

Figure 5A:
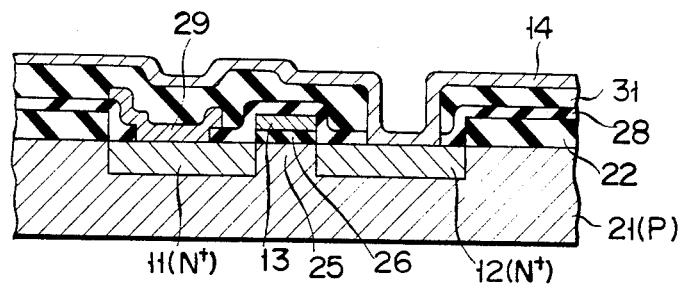
FIGS. 5A, 5B, 5C and 5D are expanded, cross-sectional views, as taken along lines 5A—5A, 5B—5B, 5C—5C and 5D—5D respectively of the arrangement of FIG. 4.
Figure 5B:
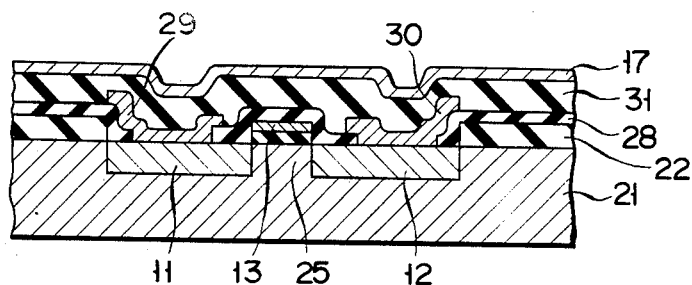
Figure 5C:
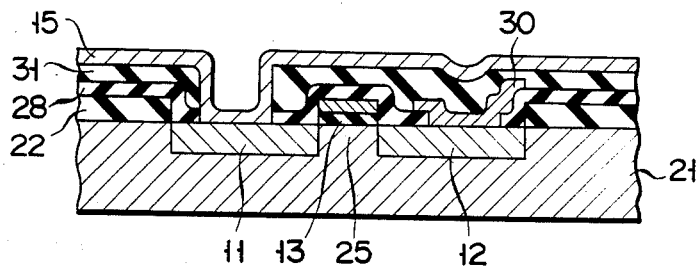
Figure 5D:
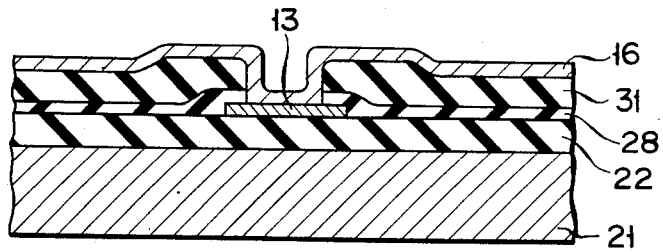

One embodiment of this invention will be explained below by referring to FIGS. 4 and 5A to 5D. For ease of understanding, like reference numerals are employed to designate like parts throughout the specification. As shown in FIG. 5A, a source region 11 (N+), drain region 12 (N+) and channel region 25 are formed in that area of a semiconductor substrate (P type) 21 where an insulating film 22 has been removed. A gate electrode 13 made of, for example, a polycrystalline silicon is formed on a gate insulating film 26 overlying the semiconductor substrate, such that it is situated above the channel region 25. A second insulating layer 28 is covered on the source region 11, drain region 12, gate electrode 13 and insulating film 22. As shown in FIG. 5B a first electrical conductive layer (Al) 29 is formed on the source region 11 through a hole provided on the second insulating layer 28 and a second electrical conductive layer 30 is formed on the drain region 12 through a hole provided on the second insulating layer 28. A third insulating layer 31 is formed on the second insulating layer 28, first electrical conductive layer 29 and second electrical conductive layer 30. As shown in FIG. 5A, a drain takeout electrode 14 is brought out through a hole provided through the second and third insulating layers 28 and 31. The drain takeout electrode 14 is extended on the third insulating layer 31 except for that portion of the electrode 14 which contacts with the drain region 12, and acrosses the first electrical conductive layer 29. As shown in FIG. 5C, a source takeout electrode 15 is brought out through a hole provided on the insulating layers 28 and 31. The source takeout electrode 15 is extended on the third insulating layer 31 except for that portion of the source takeout electrode 15 which contacts with the source region 11, and acrosses second electrical conductive layer 30. As shown in FIG. 5D, the gate electrode 13 is extended onto the first insulating layer 22 and once covered with the second insulating layer 28 and third insulating layer 31. A gate takeout electrode 16 made of aluminum has its portion contacted with the end portion of the gate electrode 13 through a hole provided through the second and third insulating films 28, 31, the remaining portion of the electrode 16 being extended on the third insulating layer 31 such that it is in parallel with the source takeout electrode 15. In this embodiment, interconnection layers 17, 18 are extended across the first electrical conductive layer 29 on the source region 11 and across second electrical conductive layer 30 on the drain region 12 with the insulating layer therebetween. The number of interconnection layers and the direction in which the interconnection layer extends across the electrical conductive layer can be varied in a variety of ways. The electrical conductive layers 29 and 30 are provided to lower the sheet resistance of the source and drain regions and exist only on these regions. The electrical conductive layers are electrically insulated from the interconnection layers 17 and 18 and are not directly connected to the drain takeout electrode 14 and source takeout electrode 15. The first and second electrical conductive layers 29 and 30 are formed as the lower (or the first) layer and the interconnection layers 17, 18, source and drain takeout electrodes 15, 14 and gate takeout electrode 16 are formed as the upper (or the second) layer.

Figure 1:
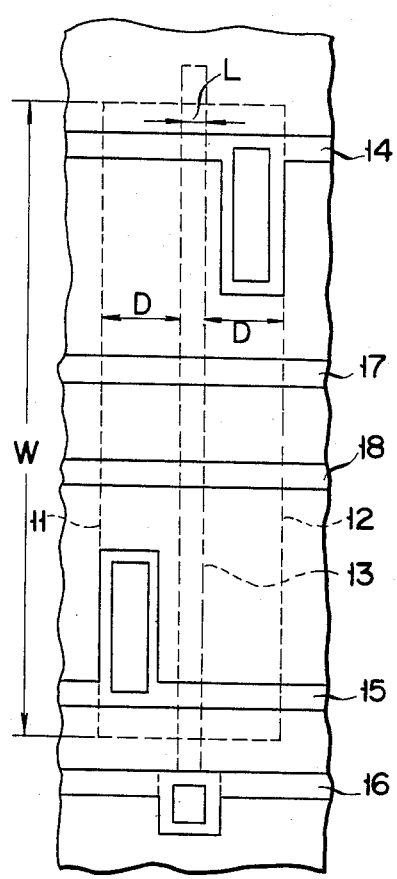
FIG. 1 is a plan view diagrammatically showing part of a conventional semiconductor IC circuit including insulated gate field effect transistors.
Figure 4:
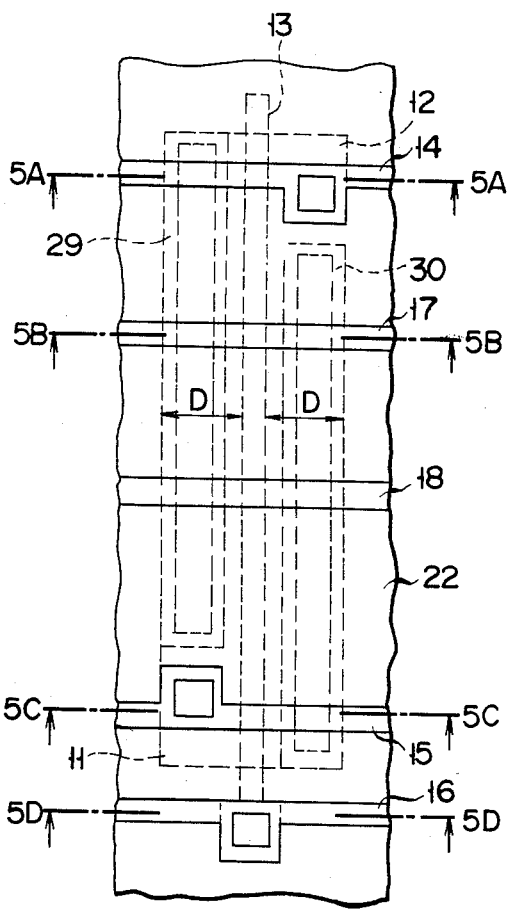
FIG. 4 is a plan view diagrammatically showing part of one embodiment of a semiconductor IC device of this invention.
Figure 2A:
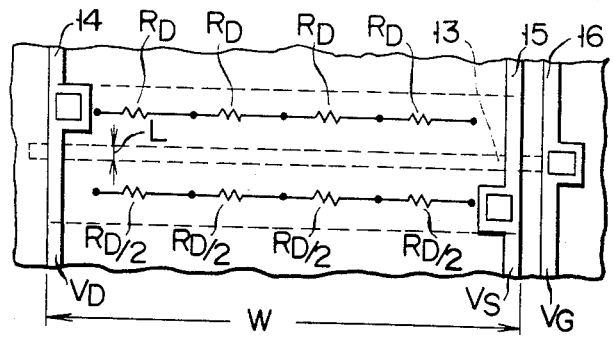
FIG. 2A is a view showing the distribution of a stray resistance as occurring in the source and drain regions of the insulated gate field effect transistor of FIG. 1.
Figure 2B:
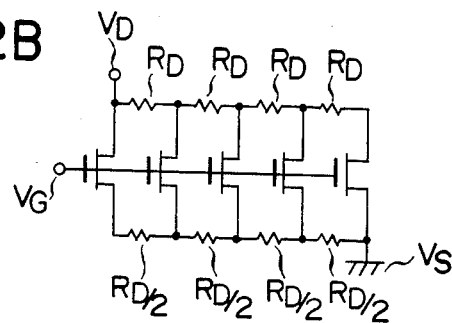
FIG. 2B is an equivalent circuit of FIG. 2A.
Figure 3:
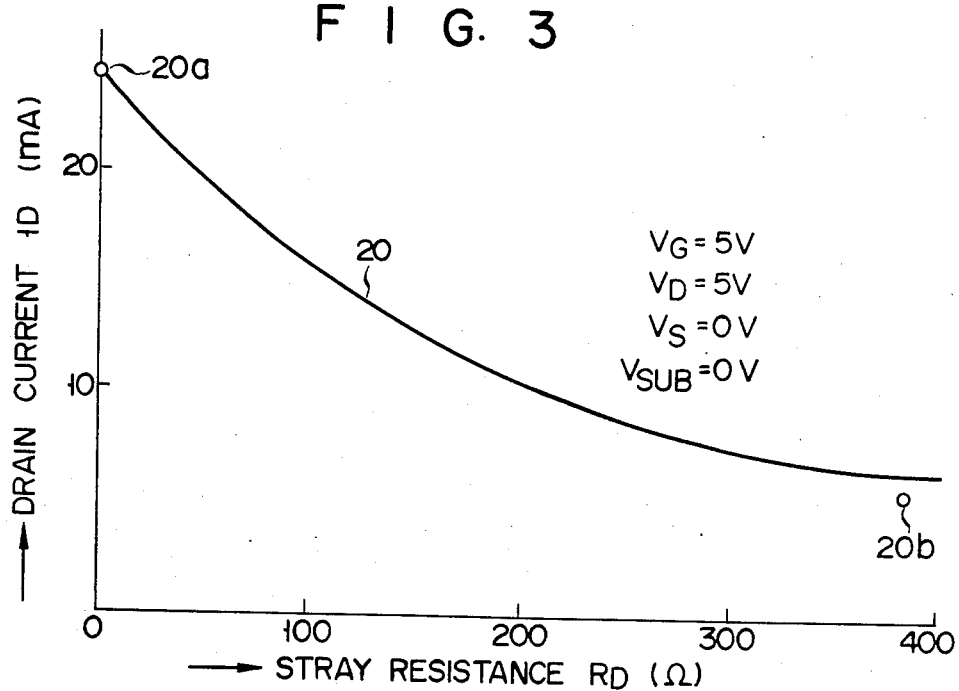
FIG. 3 is a graph showing a relation, to the drain current, of a stray resistance present in the source and drain regions of the insulated gate field effect transistor.

The sheet resistivity of the source and drain regions of the transistor in the IC device so arranged can be reduced to below 1 $\Omega/\square$ as compared with 20 $\Omega/\square$ of the conventional counterpart. Since, therefore, the stray resistance as set out in FIGS. 2A and 2B can be greatly reduced, a larger drain current can be taken out, resulting in the greater operation speed of the integrated circuit and a smaller dissipation power. Furthermore, since the above-mentioned stray resistance can be made smaller, the widths D of the source and drain regions can be made to a minimum width determined by photolithography and thus the integration density of the transistors can be increased. Since the first and second electrical conductive layers 29 and 30 are not directly connected to other transistors or other interconnection layers and a current through the electrical conductive layer is very small, these layers 29 and 30 may be made thinner than any of other interconnection aluminum layers. For this reason, the electrical conductive layers 29 and 30 can be microscopically subjected to patterning and those stepped portions on the upper interconnection layer crossing these electrical conductive layers 29, 30 with the insulating layer therebetween are less conspicuous, thus enhancing the reliability of the upper interconnection layers. Although, as interconnection layers, an impurity diffusion region, ion implantation region and polycrystalline silicon region are formed in the MOS type integrated circuit, the first and second electrical conductive layrs 29 and 30 can be formed without complicating the processes by which these interconnection layers are formed. From the above it will be appreciated that the alleviation of a signal transmission delay and improvement on the characteristic of the MOS type integrated circuit can be achieved. Although the first and second electrical conductive layers are explained as being made of aluminum, use may be made of a metal such as molybdenum (Mo) and tungsten (W) and silicides with these metals.

What we claim is:

1. A seminconductor integrated circuit comprising:
    source and drain regions of a MOS transistor provided in a semiconductor substrate;
    a first insulation layer serving as a gate insulation layer and provided on the channel region between said source and drain regions;
    a gate electrode provided on said first insulation layer;
    a second insulation layer covering said source and drain regions and said gate electrode;
    first and second conductive layers provided on said second insulation layer and contacting respective surfaces of said source and drain regions through respective contact holes formed through said second insulation layer;
    a third insulation layer covering the main surface portion of said MOS transistor;
    a source takeout electrode which contacts one end of said source region and extends over said third insulation layer, and which is separated from said first conductive layer provided on said source region;
    a drain takeout electrode which contacts one end of said drain region and extends over said third insulation layer, and which is separated from said second conductive layer provided on said drain region; and
    at least one interconnection layer provided on said third insulation layer and crossing said source and drain regions.

2. A semiconductor integrated circuit device according to claim 1, wherein said first and second conductive layers, said source takeout electrode and said drain takeout electrode are made of aluminum.

3. A semiconductor integrated circuit device according to claim 1, wherein said source takeout electrode is extended over said third insulation layer so as to cross said drain region and said drain takeout electrode is extended over said third insulation layer so as to cross said source region.

* * * * *